United States Patent [19]

Misawa et al.

[11] Patent Number: 4,696,424
[45] Date of Patent: Sep. 29, 1987

[54] JUMPER WIRE INSERTING APPARATUS

[75] Inventors: Yoshihiko Misawa, Katano; Taira Ishii, Hirakata; Yoshinobu Maeda, Katano, all of Japan

[73] Assignee: Matsushita Electric Industrial Co., Ltd., Kadoma, Japan

[21] Appl. No.: 671,127

[22] Filed: Nov. 13, 1984

[30] Foreign Application Priority Data

| Nov. 14, 1983 [JP] | Japan | 58-214375 |
| Nov. 14, 1983 [JP] | Japan | 58-214379 |
| Nov. 14, 1983 [JP] | Japan | 58-214380 |

[51] Int. Cl.$^4$ .................................................. B27F 7/21
[52] U.S. Cl. .................................... 227/84; 29/566.1; 227/90; 227/155
[58] Field of Search ............... 29/33 F, 33 K, 33 M, 29/564, 564.1, 564.6, 564.7, 564.8, 566, 566.1; 227/90, 155; 277/84

[56] References Cited

U.S. PATENT DOCUMENTS

| 2,884,635 | 5/1959 | Hagar | 227/90 |
| 3,263,467 | 8/1966 | Gagnon | 227/90 |
| 3,740,817 | 6/1973 | Weiler et al. | 29/564.6 |
| 4,516,310 | 5/1985 | Bandura | 29/564.8 |

Primary Examiner—Gil Weidenfeld
Assistant Examiner—Daniel W. Howell
Attorney, Agent, or Firm—Cushman, Darby & Cushman

[57] ABSTRACT

In a jumper wire inserting apparatus, a transforming members has a fixed member and a movable member, thereby to transform the jumper wire accurately by transferring the movable member only responding to respective pitches of pairs of holes of the printed circuit substrate.

5 Claims, 25 Drawing Figures

FIG.6(a)
FIG.6(c)
FIG.6(b)
FIG.7
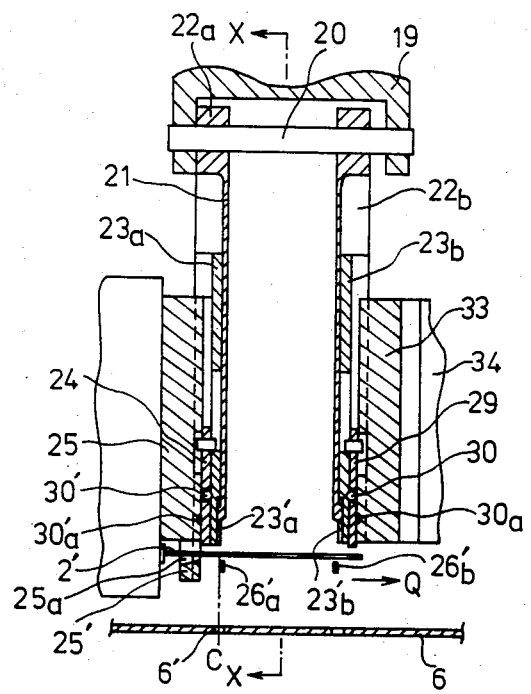
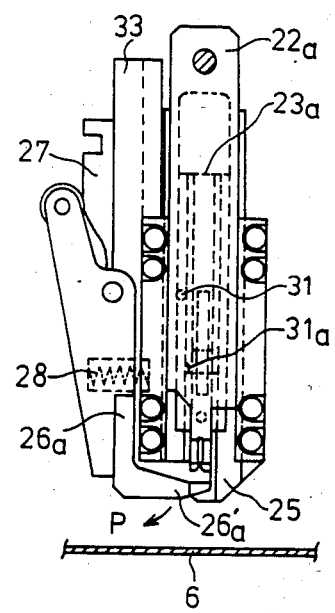
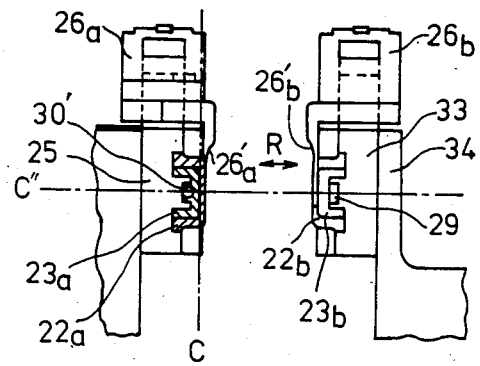
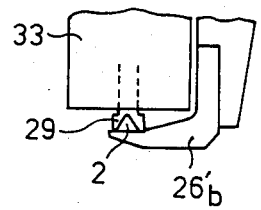

JUMPER WIRE INSERTING APPARATUS

BACKGROUND OF THE INVENTION

1. Field of the Invention:

The present invention relates to a jumper wire inserting apparatus for inserting a short wire having substantially no resistance, namely, a jumper wire into a pair of holes of a printed circuit substrate.

2. Description of the Prior Art

Hitherto, when a jumper wire inserting apparatus transforms a jumper wire responding to various distances, namely, pitches between two holes of a pair of holes of the printed circuit substrate and inserts the jumper wire into the holes by utilizing pushers and the like, both pushers are transferred in a horizontal direction responding to the various pitches of the holes. Therefore, the mechanism of the conventional jumper wire inserting apparatus is complicated and the accuracy of the transforming of the jumper wire is low.

Further, the horizontal direction transferring of the pushers and so on of the conventional jumper wire inserting apparatus does not have linkage with the operation of the jumper wire sending means for sending out a long wire for cutting to produce the jumper wire. Therefore, the accuracy of the operation of the conventional jumper wire inserting apparatus is low.

As above-mentioned, the conventional jumper wire inserting apparatus has various disadvantages.

SUMMARY OF THE INVENTION

The present invention is intended to dissolve the disadvantages of the conventional jumper wire inserting apparatus, thereby to produce such superior jumper wire inserting apparatus that the mechanism is simple and the jumper wire can be inserted into the pair of holes of the printed circuit substrate accurately responding to different pitch of the pair of holes of the printed circuit substrate.

A jumper wire inserting apparatus of the present invention comprises:

a bobbin on which a long wire is wound, a jumper wire sending member for sending the long wire to an inserting unit by a certain length responding to a pitch of a pair of holes of a printed circuit substrate, cutting members of the inserting unit for cutting the sent long wire, thereby to produce a jumper wire, transforming members of the inserting unit for transforming the jumper wire having a length corresponding to the pitch of the pair of holes of the printed circuit substrate, the transforming members comprising a first fixed members which are not transferred in a horizontal direction, and a first movable members which are transferred in a horizontal direction responding to the pitch of the pair of holes, the first fixed members being disposed at the cut end part side of the jumper wire with end part being cut by the cutting member, inserting members of the inserting unit for inserting the transformed jumper wire into the holes of the printed circuit substrate, the inserting members comprising a second fixed member which is not transferred in a horizontal direction and a second movable member which is transferred in a horizontal direction responding to the pitch of the pair of holes, and the second fixed members being disposed at the cut end part side of the jumper wire.

The jumper wire inserting apparatus has a simple mechanism and the transforming of the jumper wire responding to the pitch of the pair of holes is accurate since only the first movable members of the transforming members and the second movable member of the inserting members can transfer in a horizontal direction.

Further, a jumper wire inserting apparatus of the present invention comprises:

a bobbin for winding a long wire thereon, a jumper wire sending member for sending the long wire to an inserting unit by a certain length responding to a pitch of a pair of holes of a printed circuit substrate, cutting members of the inserting unit for cutting the long wire, thereby to produce a jumper wire, transforming members of the inserting unit for transforming the jumper wire responding to the pitch of the pair of holes of the printed circuit substrate, the transforming members comprising a first fixed members which are not transferred in a horizontal direction, and a first movable members which are transferred in a horizontal direction responding to the pitch of the pair of holes, the first fixed members being disposed at the cut end part side of the jumper wire, the end part being cut by the cutting member, inserting members of the inserting unit for inserting the transformed jumper wire into the holes of the printed circuit substrate, the inserting members comprising a second fixed member which is not transferred in a horizontal direction and a second movable member which is transferred in a horizontal direction responding to the pitch of the pair of holes, the second fixed members being disposed at the cut end part side of the jumper wire, an anvil apparatus disposed under the printed circuit substrate, the anvil apparatus comprising a fixed caulking member which is not transferred in a horizontal direction and a movable caulking member which is transferred in a horizontal direction responding to the pitch of the pair of holes, the fixed caulking member for caulking one end of the inserted jumper wire, and the movable cauling member for caulking the other end of the inserted jumper wire.

The jumper wire inserting apparatus has a simple mechanism and the transforming and the caulking of the jumper wire is accruate since only the first and second movable members of the inserting unit and the movable caulking member of the anvil apparatus can transfer in a horizontal direction responding to the pitch of the pair of holes.

Further, a jumper wire inserting apparatus of the present invention comprises:

a bobbin for winding a long wire thereon, a jumper wire sending member for sending the long wire to an inserting unit by a certain length responding to a pitch of a pair of holes of a printed circuit substrate, cutting members of the inserting unit for cutting the sent long wire, thereby to produce a jumper wire, transforming members for transforming the jumper wire responding to the pitch of the pair of holes of the printed circuit substrate, and the jumper wire sending member is cooperative with the transforming members responding to the pitch of the pair of holes.

The jumper inserting apparatus can transform accurately the jumper wire responding to the pitch of the pair of holes since the jumper wire sending member is cooperative with the transforming members responding to the pitch of the pair of holes.

BRIEF EXPLANATION OF THE DRAWING

FIG. 6(a) is a front sectional view showing an inserting unit of the present invention.

FIG. 6(b) is a base view showing the inserting unit, only a pusher and a jumper wire guide beside a fixed block being cut, of the present invention.

FIG. 6(c) is a side sectional view along X-X line of FIG. 6(a) showing the inserting unit of the present invention.

FIG. 7 is a partial side view showing the jumper wire supporting member of the present invention.

DESCRIPTION OF THE PREFERRED EMBODIMENTS

Figure 1:
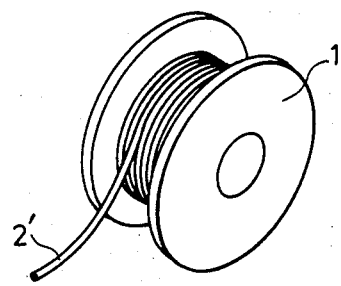
FIG. 1 is a perspective view showing a long wire for a jumper wire wound on a bobbin.
Figure 2:
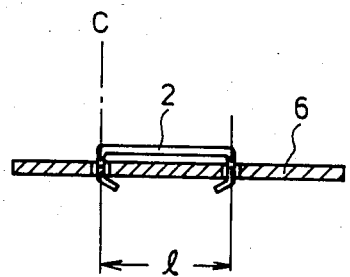
FIG. 2 is a sectional view showing a printed circuit substrate inserted with a jumper wire.
Figure 3:
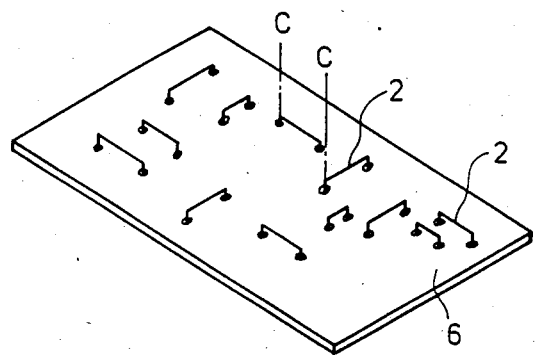
FIG. 3 is a perspective view showing a printed circuit substrate inserted with jumper wires.

A jumper wire inserting apparatus of the present invention is such apparatus that a long wire 2 wound on a bobbin 1 as shown in FIG. 1 is cut into a jumper wire 2 and transformed with center pitch 1 and further inserted into a pair of holes of a printed circuit substrate 6 in FIGS. 2 and 3.

Figure 4:
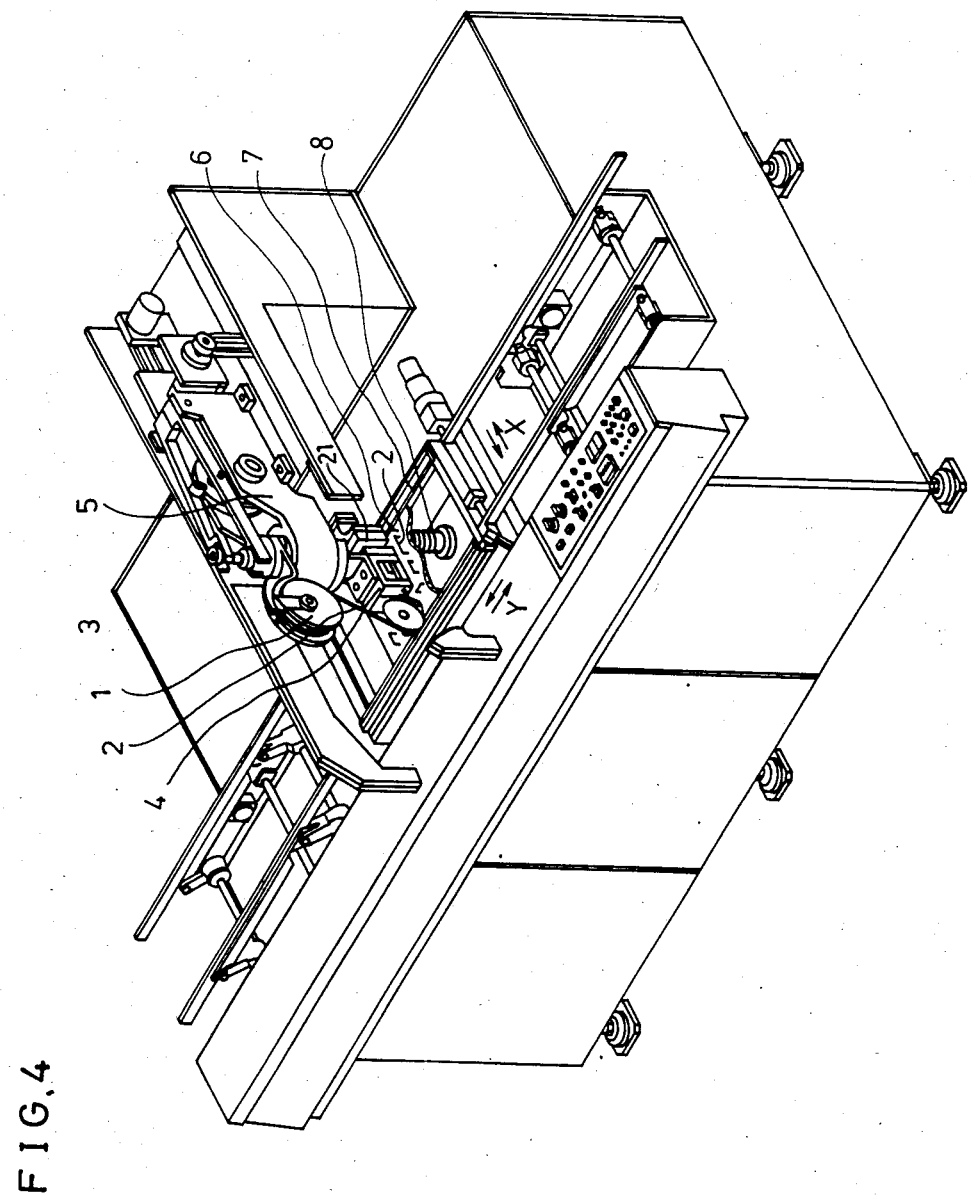
FIG. 4 is a perspective view showing an embodiment of the jumper wire inserting apparatus of the present invention.

FIG. 4 shows the perspective whole jumper wire inserting apparatus of the present invention.

The jumper wire inserting apparatus of the present invention comprises an inserting head 3 for inserting the jumper wire 2 into the holes of the printed circuit substrate 6, and an inserting head driving body 5 for rotatably holding and driving the inserting head 3. The inserting head 3 comprises a bobbin 1 having a long wire 2' wound thereon, a jumper wire sending member 4 for taking the wire 2' inside from the bobbin 1 and sending out the wire 2' by such length responding to the pitch of the pair of holes of the printed circuit substrate 6, an inserting unit 21 for cutting the wire 2', for transforming the cut wire 2', namely, jumper wire 2 responding to the pitch of the pair of holes of the printed circuit substrate 6 and for inserting the jumper wire 2 into the holes of the printed circuit substrate 6, and a jumper wire supporting member which is not shown in FIG. 4.

An X-Y table 7 is disposed under the inserting head 3 for placing the printed circuit substrate 6 at necessary position. An anvil apparatus 8 is disposed under the printed circuit substrate 6 for caulking the end parts of the jumper wire 2 in order to prevent slip out of the inserted jumper wire 2 from the holes of the printed circuit substrate 6.

The details of the inserting head 3 and the inserting head driving body 5 are described as follows.

Figure 5:
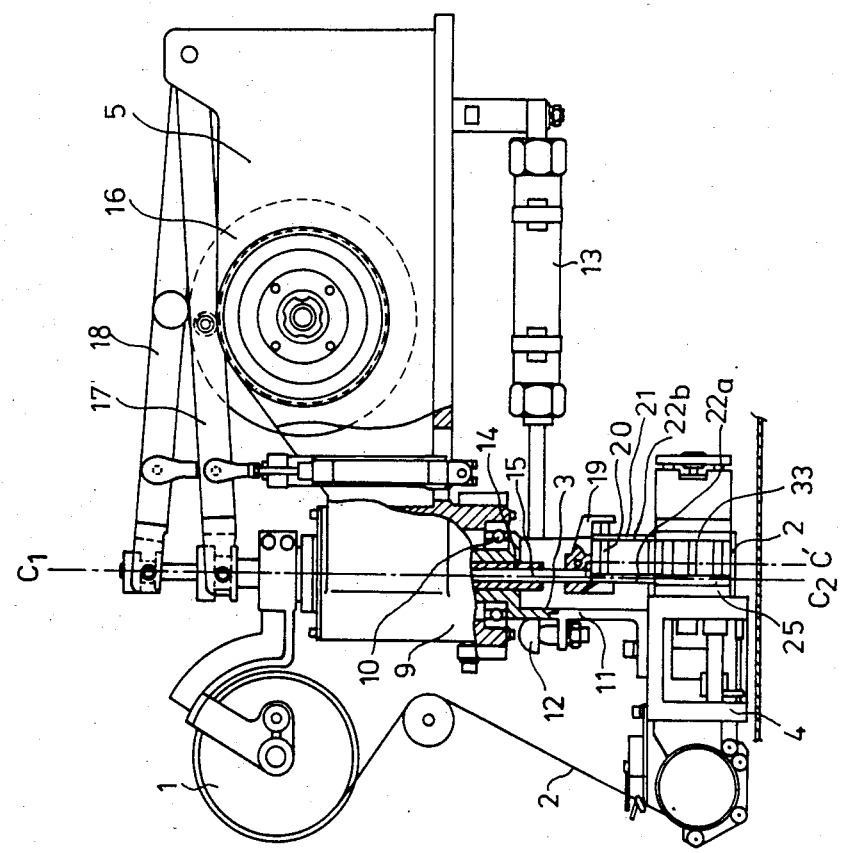
FIG. 5(a) is a front sectional view showing an inserting head and an inserting head driving body of the present invention.
FIG. 5(b) is a side sectional view showing the inserting head except a jumper wire supporting member and the inserting head driving body of the present invention.
Figure 5:
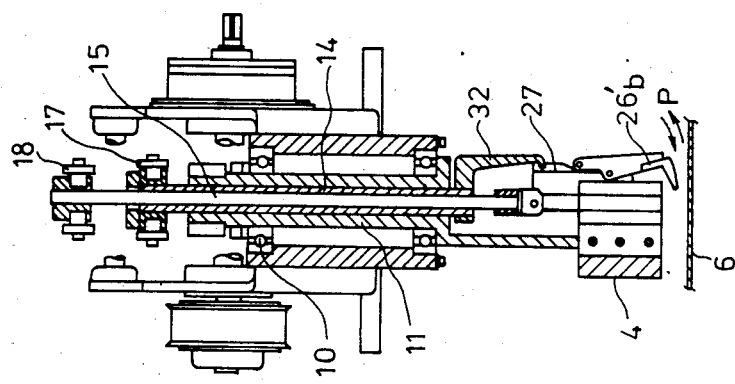

In FIGS. 5(a) and 5(b), the inserting head 3, which comprises the bobbin 1, the wire 2', the jumper wire sending member 4, the inserting unit 21 and the jumper wire supporting member 26a, 26b, etc., is connected to a frame 9 of the inserting head driving body 5 through ball bearings 10, 10, in a manner to be rotatable on a horizontal face.

A rod end 12 of a cylinder 13, fixed to the inserting head driving body 5, is connected rotatably to a main shaft 11 of the inserting head 3. The inserting head 3 is rotated horizontally by the operation of the cylinder 13. Therefore, even when the printed circuit substrate 6 has variously directed pairs of holes as shown in FIG. 3, the jumper wire 2 can be inserted into the holes of the printed circuit substrate 6. A central position of the rotation of the inserting head 3 is indicated by chain line $C_1$, $C_2$, which is corresponding to the chain line C in FIG. 3 and further corresponding to a central position of a guide groove 23'a in FIG. 6(a). Thus, even when the inserting head 3 is rotated in X-direction or Y-direction, the central position of the rotation does not get out of the one hole of the pair of the holes of the printed circuit substrate 6.

The inserting unit 21 comprises pushers 22a, 22b, a movable block 33 for guiding the pusher 22b, etc., a fixed block 25 for guiding the pusher 22a, etc. and so on. The pushers 22a, 22b are fixed to a lower end of an inserting shaft 15 inserted slidably in the main shaft 11 through a driving bracket 19 and a driving bar 20. The inserting shaft 15 is hanged to an end of a lever 18 which is transferred upwards and downwards by a rotational cam 16 fixed to the inserting head driving body 5. The jumper wire supporting member 26a, 26b is connected to the jumper wire sending member 4, with being rotatable in the direction as shown in FIG. 5(a) by arrow N. The FIG. 5(a) is a front sectional view along C₁, C' chain line in FIG. 5(b). A coupling hook 32, which is for moving the jumper wire supporting member 26b through a motion of a coupling member 27, is hanged to an end of a supporting shaft 14, which is inserted slidably in the main shaft 11. The supporting shaft 14 is hanged to an end of a lever 17 which is transferred upwards and downwards by the rotational cam 16.

Figure 8A:
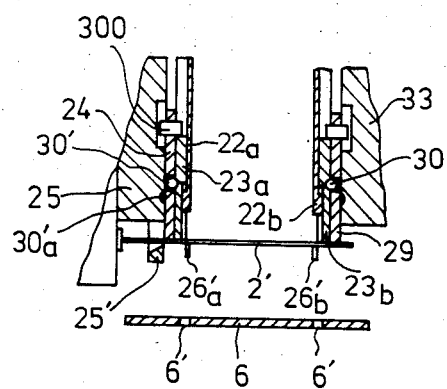
FIGS. 8(a), 8(b), 8(c), and 8(d) are partial side sectional views showing processes of cutting, transforming and inserting of the jumper wire of the present invention.
Figure 8B:
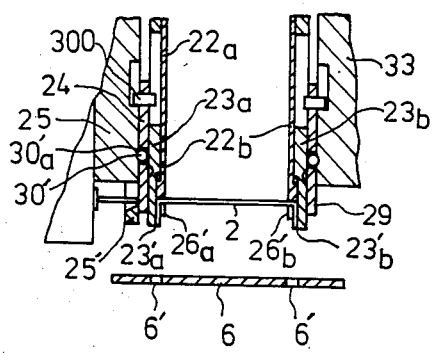
Figure 8C:
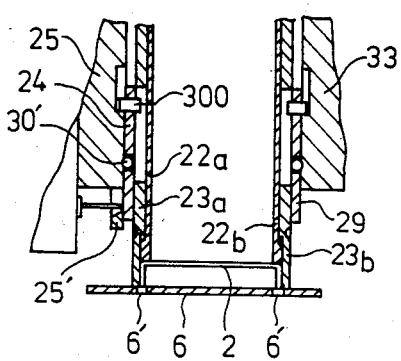
Figure 8D:
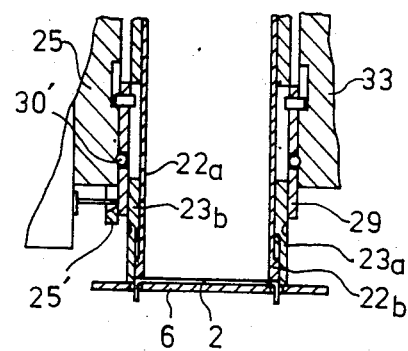

The details of the inserting unit 21 is described in FIGS. 6(a), 6(b) and 6(c). Between the pusher 22a supported by the driving bar 20 and the fixed block 25, a jumper wire guide 23a and a moving edge 24 are disposed by being connected in a manner to be each other slidable longitudinally by balls, hemispherical recesses and stoppers. Between the pusher 22b held by the driving bar 20 and the movable block 33, a jumper wire guide 23b, a leading guide 29 are disposed with being connected in a manner to be each other slidable in longitudinal direction by balls, hemispherical recesses and stoppers. Incidentally, the leading guide 29 is not for cutting the jumper wire but for stably positioning the jumper wire 2 at the transforming process as shown in FIG. 7. The moving edge 24 and an edge part 25' at the lowest part of the fixed block 25 cooperatively cut the long wire 2' which is sent out under the inserting unit 21 by the jumper wire sending member 4 through a window 25a. The lowest end tips 26'a, 26'b of the jumper wire supporting member 26a, 26b support the jumper wire 2 when the latter is transformed. The processes of the cutting, transforming and inserting of the jumper wire 2 are described in FIGS. 8(a), 8(b), 8(c) and 8(d). FIG. 8(a) shows the cutting process of long wire 2', and FIG. 8(b) shows the transforming process of the jumper wire 2. FIG. 8(c) shows that the jumper wire guides 23a and 23b reach the surface of the printed circuit substrate 6. FIG. 8(d) shows that the jumper wire 2 is inserted into the holes of the printed circuit substrate 6 by the fall operation of only the pushers 22a and 22b. That is, in FIG. 8(a), the pusher 22a falls by the driving bar 20 and the jumper wire guide 23a which is connected to the pusher 22a with a ball 31 indicated in FIG. 6(c), also falls. Further, the moving edge 24 which is connected to the jumper wire guide 23a with a ball 30', also falls. The pusher 22b, the jumper wire guide 23b and the leading guide 29 also falls by balls 30. In the same way as the pusher 22a, the jumper wire guide 23a and the moving edge 24 falls by a ball. The leading guide 29 is not an edge but is a guide for holding the tip of the jumper wire 2 in order to transfer stably the jumper wire as shown in FIG. 7.

Further, the pusher 22a, the jumper wire guide 23a and the moving edge 24 falls as shown in FIG. 8(b), therefore the moving edge 24 cuts the long wire 2' cooperatively with the edge part 25' of the fixed block 25. At the same time, since the end part of the jumper wire 2 is supported by the lowest end tip 26'a, the end part of the jumper wire 2 is transformed in downward direction by being guided by the guide groove 23'a of the jumper wire guide 23a. The other end part of the jumper wire 2 is also transformed in downward direction by the guide groove 23'b of the jumper wire guide 23b. When the moving edge 24 comes to the position shown in FIG. 8(b), the ball 30' falls in the hemispherical recess 30'a of the fixed block 25 and the stopper 300 operates. Therefore, the moving edge 24 is fixed to the fixed block 25. At the same time, the coupling of the jumper wire guide 23a and the moving edge 24 is dissolved since the ball 30' gets out of the hemispherical recess of the jumper wire guide 23a. Therefore, only the jumper wire guide 23a and the pusher 22a fall further as shown in FIG. 8(b).

The leading guide 29 is also fixed to the moving block 33 by the ball 30 and stopper 300' in the same way as the moving edge 2 and the fixed block 25. And the coupling of the jumper wire guide 23b and the leading guide 29 is dissolved in the same way as the jumper wire guide 23a and the moving edge 24. Therefore, only the jumper wire guide 23b and the pusher 22b fall further as shown in FIG. 8(b).

Then, the lowest end tips 26'a, 26'b, the jumper wire supporting member 26 is removed from the lower position of the jumper wire 2 by rotating the jumper wire supporting member 26 in outside direction by the supporting shaft 14.

The details of the operation is as follows. As shown in FIG. 5(a) and FIG. 5(c), when the supporting shaft 14 rises, the coupling hook 32 fixed to the supporting shaft 14 also rises and the coupling member 27 also rises. Accordingly, the upper part of the jumper wire supporting member 26a, 26b rotates inside by the force of the compressed spring 28 since the lower part of the coupling member 27 is removed in upper direction. Therefore, the lowest end tip 26'b of the jumper wire supporting member 26 is removed outside as shown by arrow P.

Further, the pusher 22a, 22b and the jumper wire guides 23a, 23b fall down with the jumper wire 2 as shown in FIG. 8(c). When the jumper wire guides 23a, 23b reaches the surface of the printed circuit substrate 6, the balls 31, coupling the pushers 22a, 22b and the jumper wire guides 23a, 23b, get into the recesses 31a, of the blocks 25, 33 and stoppers (not shown in Figures) operate. Therefore, the jumper wire guides 23a, 23b are fixed to the blocks 25, 33 and the coupling of the pushers 22a, 22b and the jumper wire guides 23a, 23b are dissolved.

Further, the pushers 22a, 22b fall, thereby, to insert both end part of the jumper wire 2 into the holes of the printed circuit substrate 6 as shown in FIG. 8(d).

The rising processes of the inserting unit 21 are executed as being contrary to the above-mentioned falling processes of the inserting unit 21.

The length between the breaking points of the transformed jumper wire 2 and the sending out length of the long wire 2' are variable responding to the pitch of the pair of holes of the printed circuit substrate 6. The mechanism for varying the lengths is as follows.

As shown in FIGS. 6(a), 6(b), 6(c) and FIG. 6(d), the pusher 22b is held and guided by the moving block 33, and the moving block 33 is fixed to the bracket 34 which is supported slidably in horizontal direction by the jumper wire sending member 4. Thus, the pusher 22b can be transferred according to the movement of the bracket 34 is horizontal direction as indicated by an arrow R in FIG. 6(b), thereby to vary the length between the cutting points of the transformed jumper wire 2. At the same time, the jumper wire supporting member 26b transfers in horizontal direction according to the movement of the bracket 34.

The mechanism of the length variation is described as follows.

Figure 9:
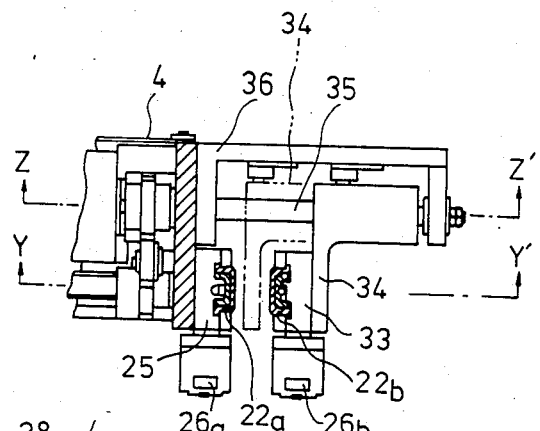
FIG. 9 is a partial plane view showing a jumper wire sending member and the inserting unit of the present invention.

In the FIG. 9, the bracket 34 is supported by the shaft 35 slidably in horizontal direction. Therefore, the distance between the pushers 22a, 22b and the distance between the jumper wire supporting members 26a, 26b, varies responding to the movement of the bracket 34. The pusher 22a is held and guided by the fixed block 25 which is fixed to the jumper wire sending member 4.

Figure 10:
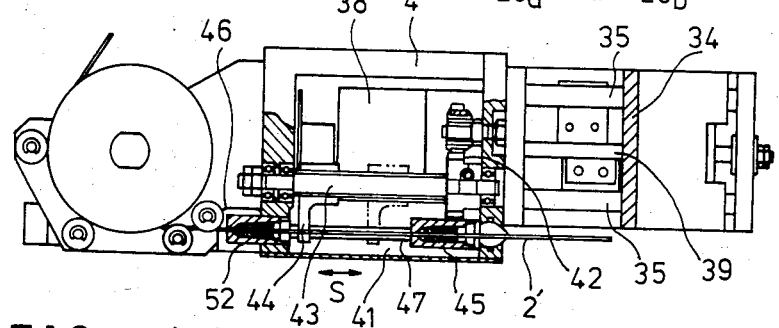
FIG. 10(a) is a side sectional view showing the jumper wire sending member and the inserting unit except the pusher, etc., of the present invention.
FIG. 10(b) is a still side sectional view showing the jumper wire sending member and the inserting unit except the pusher etc., of the present invention.
Figure 10:
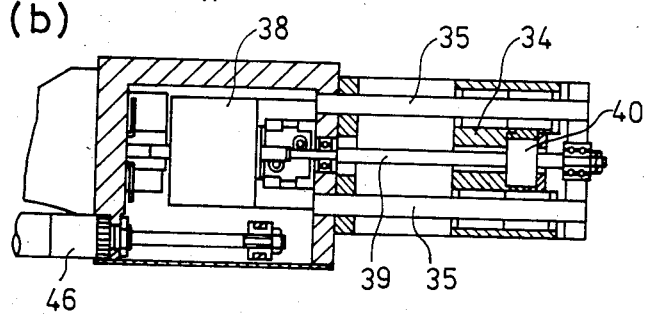

FIGS. 10(a) and 10(b) are front sectional view of the jumper wire sending member 4 and the bracket 34 and the shaft 35. FIG. 10(a) is a sectional view along the chain line Y, Y' in FIG. 9, and FIG. 10(b) is a sectional view along the chain line Z, Z' in FIG. 9.

The ball screw 39 rotates by the pulse motor 38 and the bracket 34 transfers by the ball screw 39 through a ball screw nut 40. Therefore, the pusher 22b and the jumper wire supporting member 26b can transfer.

The main part 41 of the jumper wire sending member 4 is as follows. As above-mentioned, the pulse motor 38 operates in order to move the pusher 22b and the jumper wire supporting member 26b and at the same time the square screw 43 is rotated by the pulse motor 38 through an idle gear 42, thereby to transfer a stopper 44 in horizontal direction as indicated by an arrow S in FIG. 10(a). Therefore, the transfer amount of the stopper 44 and the transfer amount of the bracket 34 are corresponding to each other responding to the pitch of the pair of the holes. A transfer amount of a sending member 45 for sending out the long wire 2' by certain length, is controlled by the position of the stopper 44.

Figure 11:
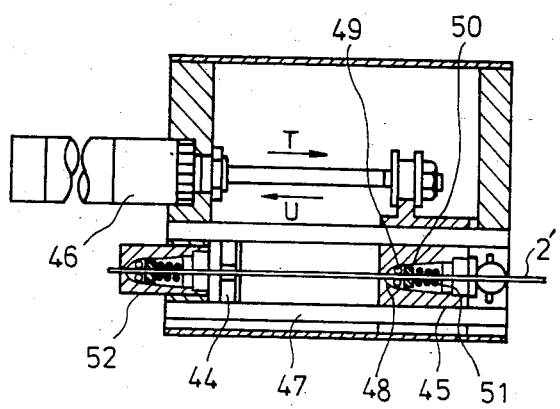
FIG. 11 is a lateral sectional view showing the jumper wire sending member of the present invention.

That is, the sending member 45 is transferred on the shaft 47 by the sending cylinder 46 being controlled by the stopper 44, thereby to send out the long wire 2' as shown in FIG. 11. Therefore, the sending out length of the long wire 2' is controlled by the position of the stopper 44, therefore the sending out length of the long wire 2' is responding to the pitch of the pair of holes. The sending member 45 comprises a taper face 48, three or four articles of balls 49, 49, 49, a press member for pressing the balls 49, 49, 49 by a compressed spring 51. When the sending member 45 is transferred in the direction T by the cylinder 46, the balls 49, 49, 49 transfer in the reverse direction U, thereby to clinch the long wire 2' on account of the taper face 48. When the sending member 45 is transferred in the direction U by the cylinder 46, the reverse movement of the long wire 2' is prevented by a stopping member 52 fixed to the jumper wire sending member 4. That is, the stopping member 52 has same mechanism as the sending member 45 and when the long wire 2' is going back, balls in the stopping member 52 is transferred in the direction U, thereby to clinch the long wire 2' on account of a taper face of the stopping member 52. Incidentally, the balls 49, 49, 49 of the sending member 45 does not clinch the long wire 2' because of the taper face 48 when the sending member 45 moves inversely.

Figure 12:
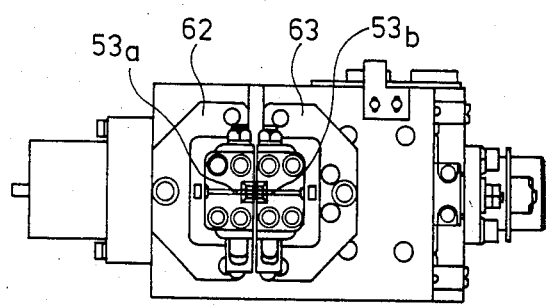
FIG. 12 is a plane view showing an anvil apparatus of the present invention.
Figure 13:
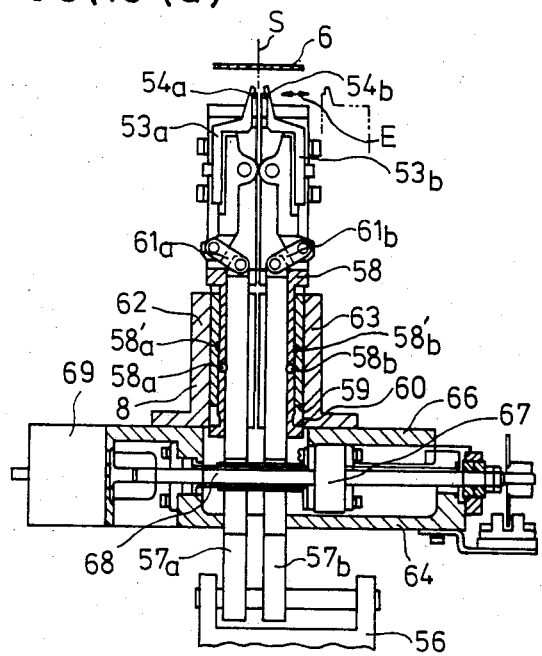
FIG. 13(a) is a front sectional view showing an upper part of the anvil apparatus of the present invention.
FIG. 13(b) is a partial front view showing a top part of the upper part of the anvil apparatus of the present invention.
FIG. 13(c) is a partial plane view showing the top part of the upper part of the anvil apparatus of the present invention.
Figure 14:
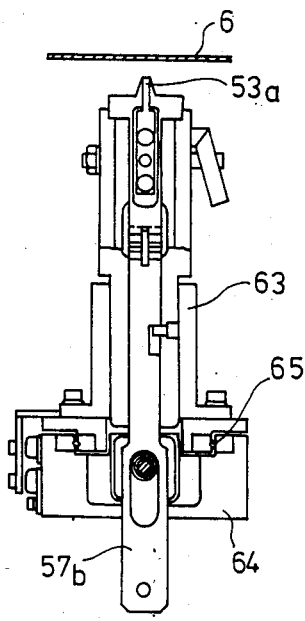
FIG. 14 is a partly cut side view showing the upper part of the anvil apparatus of the present invention.
Figure 13:
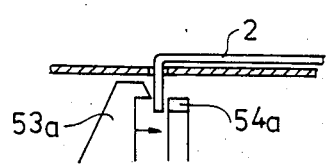
Figure 13:
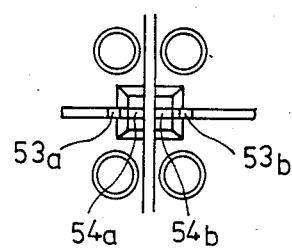
Figure 15:
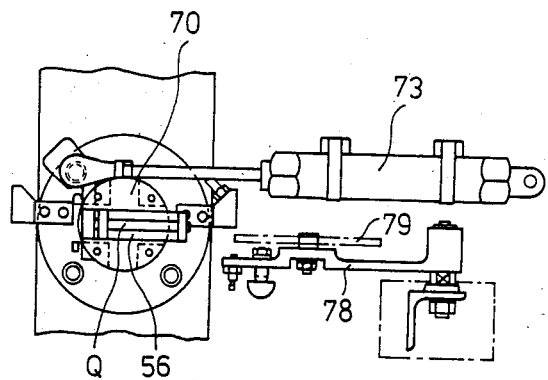
FIG. 15 is a plane view showing the lower part of the anvil apparatus of the present invention.
Figure 16:
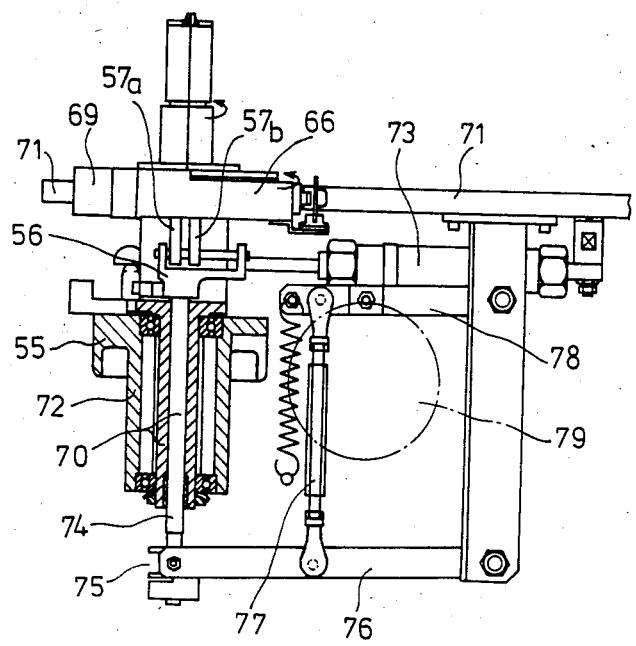
FIG. 16 is a partly cut front view showing the anvil apparatus of the present invention.

FIG. 12 is a plane view showing the anvil apparatus, FIG. 13(a) is a front sectional view showing an upper part of the anvil apparatus, FIG. 13(b) is a partial front view showing a top part of the upper part of the anvil apparatus and FIG. 13(c) is a partial plane view showing the top part of the upper part of the anvil apparatus. FIG. 14 is a left side view cut at lower half part to show the upper part of the anvil apparatus. FIG. 15 is a plane view showing a lower part of the anvil apparatus and FIG. 16 is a front view being partly cut showing the whole anvil apparatus.

In FIGS. 12, 13(a), 13(b), 13(c), 14, 15 and 16, an anvil apparatus 8 for cutting the end part of the jumper wire 2 and caulking it, is shown.

Between a moving anvil edge 53a and a fixed anvil edge 54a which are for cutting and caulking the end part of the jumper wire 2, there is a space for inserting the end part of the jumper wire 2 as shown in FIG. 13(b). The upper part unit 58 of the anvil apparatus 8 rises by the rods 57a, 57b through balls 58a, 58b. The rising of the upper part unit 58 is stopped when the touch part 60 of the upper part unit 58 touches the stopper face 59 of a movable frame 63. When the stopping status, balls 58a, 58b get into hemispherical recess 58'a, 58'b, thereby to dissolve the coupling of the rods 57a, 57b and the upper part unit 58, and the moving anvil edges 53a, 53b reach the under surface of the printed circuit substrate 6, and further the end part of the jumper wire 2 is got in between the moving anvil edges 53a, 53b and the fixed anvil edges 54a, 54b as shown in FIG. 13(b).

Further, only the rods 57a, 57b rise, thereby to raise the moving anvil edges 53a, 53b up to the fixed anvil edges 54a, 54b through the toggle bars 61a, 61b as shown by arrow in FIG. 13(b) and make both edges 53a, 53b, 54a, 54b cross to each other. Therefore, both the end parts of the jumper wire 2 are cut and caulked. Thus the jumper wier 2 is fixed firmly to the printed circuit substrate 6.

The movable frame 63 can be transferred in a horizontal direction E with the moving anvil edge 53b, the fixed anvil edge 54b, the toggle bar 61b, rod 57b and the upper part unit 58b. The movable frame 63 is transferred by utilizing a linear roller bearing 65 on a main body 64 of the upper part of the anvil apparatus. A fixed frame 62, the moving anvil edge 53a, the fixed anvil edge 54a and the toggle bar 61a are not transferred in horizontal direction. The movable frame 63 is driven by a pulse motor 69 in a manner that the pulse motor 69 rotates a screw bar 68, thereby to transfer a nut 67 which is fixed to a main frame 66 fixed to the moving frame 63. The pulse motor 69 can drive cooperatively with the pulse motor 38.

In FIGS. 15 and 16, a lower anvil unit 70 is supported slidably by a main anvil frame 72 which is connected to a base 71. The lower anvil unit 70 is rotated by a cylinder 73 with a driving bar 56 connected to the rods 57a, 57b and the upper part including the main part 66 of the anvil apparatus 8. The central position of the rotation is indicated by Q in FIG. 15. The central position Q is corresponding to the central position S of the space between the moving anvil edge 53a and the fixed anvil edge 54a in FIG. 13. The rotation of the lower anvil unit 70 and the upper part of the anvil apparatus 8 is controlled responding to the direction of the jumper wire 2. The driving bar 56 is connected to the driving rod 74 and is transferred upwards and downwards by a rotation cam 79 which drives a cam bar 78, a coupling rod 77 and a cam lever 76 connected to the lowest end of the driving rod 74.

As above-mentioned, the jumper wire inserting apparatus has a simple mechanism and can transform the jumper wire accurately and automatically responding to the pitch of the pair of holes of the printed circuit substrate.

What is claimed is:

1. Jumper wire inserting apparatus comprising:
    a bobbin on which wire is wound;
    an inserting unit;
    jumper wire sending means for sending wire from said bobbin to said inserting unit, said sending means including means to control the length of the sent wire to be proportionate to the pitch of a pair of holes in a printed circuit substrate;

cutting means on said inserting unit for cutting the sent wire to produce a jumper wire;

transforming means on said inserting unit for bending the ends of the jumper wire to transform it to a length corresponding to the pitch of the hole pair, said transforming means comprising first fixed members adjacent said cutting means and first movable members spaced from and adjustable toward and away from said first fixed members to correspond to the pitch of the hole pair;

means on said inserting unit for inserting the bent ends of the transformed jumper wire into the pair of holes in the printed circuit substrate, said inserting means comprising a second fixed member adjacent said cutting means and a second movable member adjustable, with said first movable members, toward and away from said second fixed member to correspond to the pitch of the hole pair; and means connected to said transforming means, to said inserting means and to said sent wire length control means for simultaneously adjusting said first movable members, adjusting said second movable member and controlling the length of the sent wire.

2. Jumper wire inserting apparatus in accordance with claim 1 wherein the jumper wire sending means includes means to change the direction of sending the wire, and including means mounting the transforming means and the inserting means for rotation around a common axis.

3. Jumper wire inserting apparatus according to claim 1 including anvil apparatus adapted to be disposed beneath the printed circuit substrate and comprising a fixed calking member for calking one end of the inserted jumper wire and a movable calking member for calking the other end of the inserted jumper wire, said movable calking member being adjustable toward and away from said fixed calking member to correspond to the pitch of the hole pair.

4. Jumper wire inserting apparatus in accordance with claim 3 wherein the jumper wire sending means includes means to change the direction of sending the wire, and including means mounting the transforming means, the inserting means, and the anvil apparatus for rotation about a common axis adjacent the fixed members of the transforming means, the fixed member of the inserting means and the fixed calking member, said axis being coaxial with one of the pair of holes.

5. Jumper wire inserting apparatus according to claim 1 in which the inserting unit includes guide means for, and screw means for adjusting, the movable member, and driving means for driving said screw means to vary the distance between the fixed and movable members.

* * * * *